(12) United States Patent
Gloisten et al.

(10) Patent No.: US 7,738,235 B2
(45) Date of Patent: Jun. 15, 2010

(54) LED LIGHT APPARATUS

(75) Inventors: Jennifer L. Gloisten, Farmingville, NY (US); Frederick Reisfeld, Commack, NY (US); Glenn T. Schmidt, Selden, NY (US); Samuel Zeng, Flushing, NY (US)

(73) Assignee: B/E Aerospace, Inc., Wellington, FL (US)

( * ) Notice: Subject to any disclaimer, the term of this patent is extended or adjusted under 35 U.S.C. 154(b) by 989 days.

(21) Appl. No.: 11/496,178

(22) Filed: Jul. 31, 2006

(65) Prior Publication Data

US 2008/0025028 A1    Jan. 31, 2008

(51) Int. Cl.
*H01H 47/00* (2006.01)
(52) U.S. Cl. ...................................... 361/173
(58) Field of Classification Search .................. 361/173
See application file for complete search history.

(56) References Cited

U.S. PATENT DOCUMENTS

| | | | |
|---|---|---|---|
| 5,497,465 A | 3/1996 | Chin et al. | |
| 5,720,548 A | 2/1998 | Geary | |
| 6,161,910 A | 12/2000 | Reisenauer et al. | |
| 6,483,439 B1 | 11/2002 | Vukosic | |
| 6,533,445 B1 * | 3/2003 | Rogers | 362/540 |
| 6,697,130 B2 | 2/2004 | Weindorf et al. | |
| 6,880,276 B2 * | 4/2005 | Strein et al. | 40/442 |
| 6,964,501 B2 | 11/2005 | Ryan | |
| 6,974,234 B2 | 12/2005 | Galli | |
| 6,979,100 B2 * | 12/2005 | Reiff et al. | 362/184 |
| 7,018,065 B2 * | 3/2006 | Tamai | 362/247 |
| 7,588,351 B2 * | 9/2009 | Meyer | 362/294 |

* cited by examiner

*Primary Examiner*—Stephen W Jackson
(74) *Attorney, Agent, or Firm*—Drinker Biddle & Reath LLP

(57) ABSTRACT

In one aspect, a compact, lightweight, high-intensity and long-life LED lighting apparatus is provided. The LED lighting apparatus includes: a lens array including a plurality of lenses; a first circuit board including at least one LED (e.g., a plurality of surface-mount type LEDs); and a second circuit board electrically connected with the first circuit board to control illumination of the plurality of LEDs, wherein the second circuit board is configured substantially perpendicular to the first circuit board. In another aspect, a heat dissipation assembly is provided for a lighting apparatus that includes a first circuit board with at least one LED, and a second circuit board configured substantially perpendicular to the first circuit board.

38 Claims, 13 Drawing Sheets

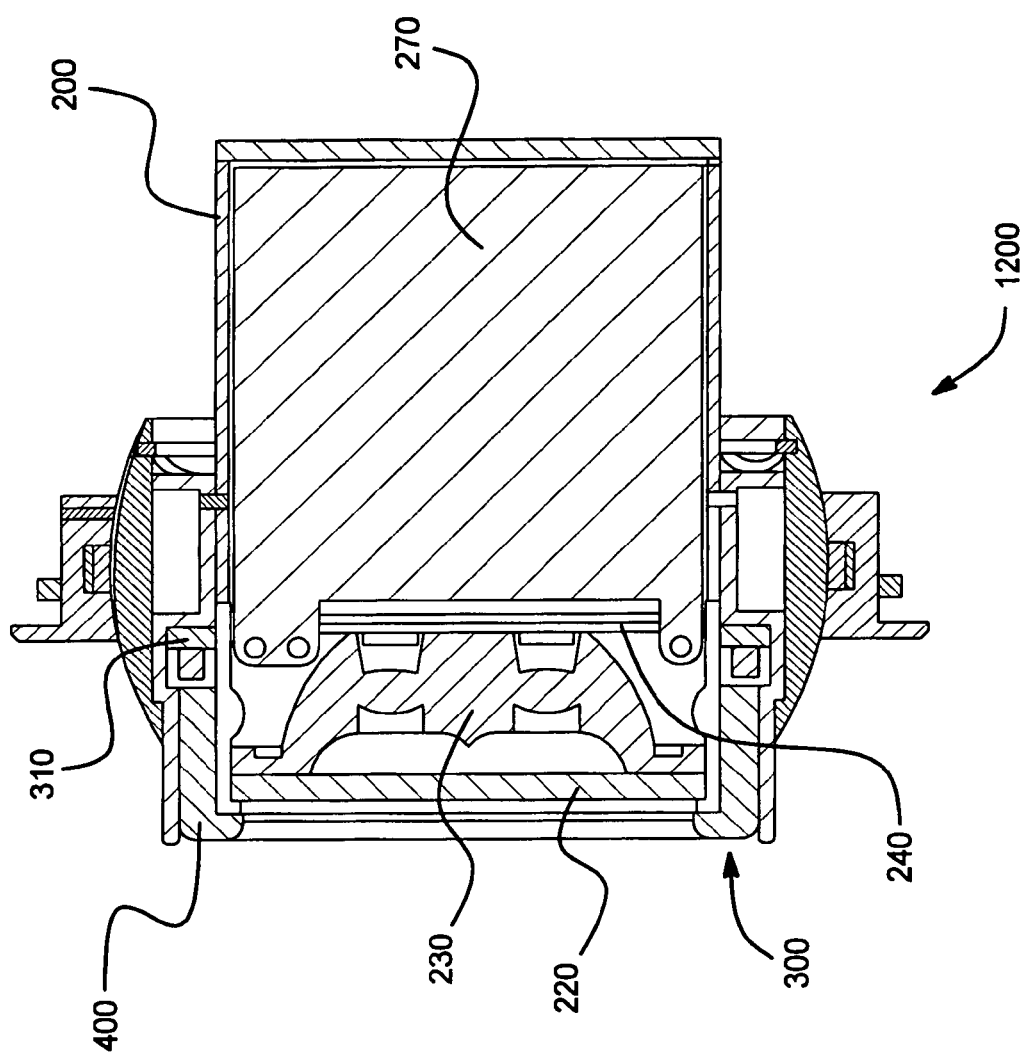
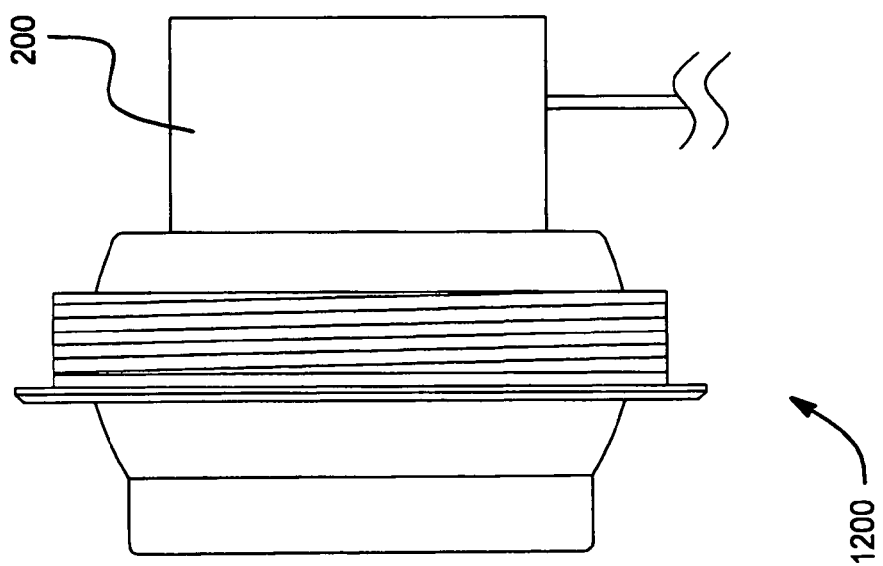

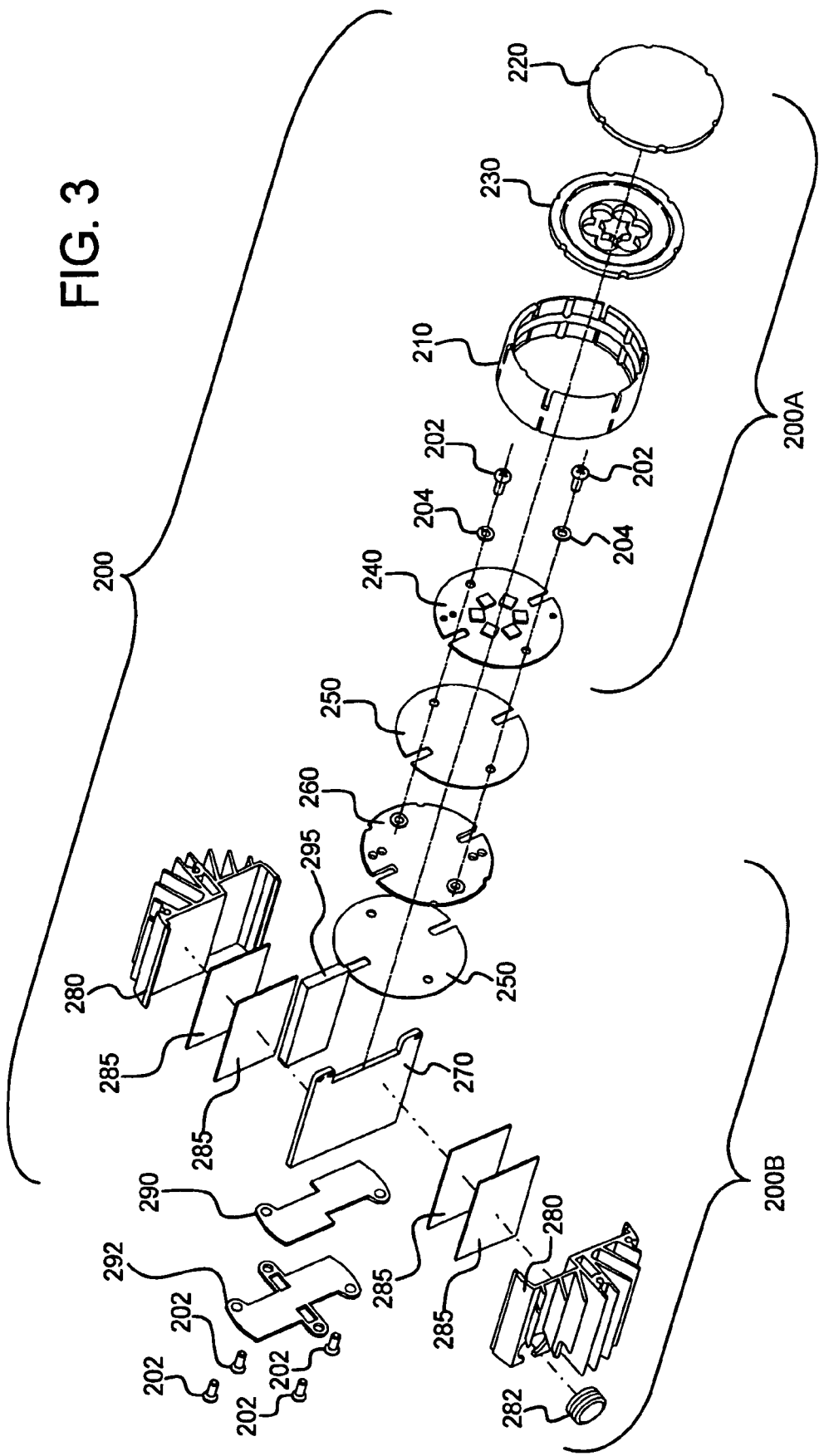

US 7,738,235 B2

LED LIGHT APPARATUS

FIELD OF THE INVENTION

This invention generally pertains to a lighting apparatus, and more particularly to a compact LED lighting apparatus for use with lighting fixtures on a vehicle, for example, an aircraft.

BACKGROUND OF THE INVENTION

Conventional light emitting diode (LED) lighting apparatuses require a trade-off between output light intensity and lifespan of the apparatus. More specifically, as higher power and higher concentrations of LEDs are used, the increased heat generated by the LEDs reduces operational efficiency and, ultimately, detrimentally affects the lifespan of the apparatus. To this end, there has been a growing need to provide LED lighting apparatuses with improved heat dissipation mechanisms. As is known in the art, cooling LEDs in lighting fixtures typically involves mounting the LEDs in a manner which thermally connected the LEDs directly or indirectly to a heat sink or heat exchanger that dissipates the heat into the surrounding ambient environment at a heat-transfer rate dependent upon the conditions of the ambient environment. Although such heat dissipation mechanisms can be effective, they introduce a further trade-off between heat dissipation ability and the size and weight of the apparatus. That is, conventional heat dissipation mechanisms (e.g., including fans, cooling fins, spacing assemblies, etc.) typically make a LED lighting apparatus large and heavy.

For example, one existing LED lighting apparatus 100 illustrated in FIG. 1 comprises an LED module 110, a thermal pad 120 in contact with the LED module 110, a heat sink including a first portion 130 in contact with the thermal pad 120 and a second portion 140, and a control module 150 and thermal pad 160 disposed in the heat sink. As shown, the LED module 110 includes a circuit board 112, for example a printed circuit board (PCB), and a plurality of through-hole LEDs 114, for example high-intensity white LEDs, mounted to the circuit board 112. The thermal pad 120 transfers heat generated by the plurality of LEDs 114 to the first portion 130 of the heat sink. Heat that is transferred to the first portion 130 flows radially outward and then toward the second portion 140 where a plurality of fins 142 dissipates heat to the ambient environment. The control module 150, which comprises a circuit board 152 with electronic components and circuitry for controlling operation of the LED module 110, is thermally isolated from the LED module 110 by being disposed in the first and second portions 130, 140 and by the thermal pad 160. Although the heat dissipation mechanism (i.e., the thermal pads 120, 160 and heat sink portions 130, 140) of the LED lighting apparatus 100 is effective for dissipating heat from the plurality of LEDs 114, the mechanism causes the apparatus to be somewhat larger and heavier than is desirable, and, therefore, unsuitable for application in some lighting fixtures, for example in vehicles where size and weight of components are preferably minimized.

Thus, in view of the foregoing, it would be desirable to provide a compact, lightweight, high-intensity and long-life LED lighting apparatus.

BRIEF SUMMARY OF THE INVENTION

In an embodiment, an LED lighting apparatus includes: a lens array including a plurality of lenses; a first circuit board including at least one slot and a plurality of LEDs (e.g., surface-mount LEDs), each LED of the plurality of LEDs being aligned with a lens of the plurality of lenses; and a second circuit board electrically connected with the first circuit board to power illumination of the plurality of LEDs, the second circuit board including a body portion and at least one projection extending from an edge of the body portion, wherein the body portion is substantially perpendicular to the first circuit board when the at least one projection is engaged in the at least one slot. The LED lighting apparatus may further include a heat dissipation assembly comprising: a first thermal pad configured on a side of the first circuit board opposite the plurality of LEDs; at least one second thermal pad configured on at least one side of the body portion; and a heat exchanger including an interior cavity and a plurality of exterior fins, the interior cavity configured to substantially encompass the body portion and dissipate heat from the first thermal pad and the at least one second thermal pad.

In another embodiment, the LED lighting apparatus may include a third circuit board including a second plurality of LEDs, and a light pipe configured to receive light from the second plurality of LEDs. The second circuit board may be connected with the third circuit board to control the second plurality of LEDs independently from the plurality of LEDs on the first circuit board, for example, as emergency lighting for a vehicle interior.

BRIEF DESCRIPTION OF THE DRAWINGS

FIG. 2A illustrates a side view of an example lighting fixture employing the embodiment of FIG. 2;

FIG. 2B illustrates a sectional side view to show internal components of the example lighting fixture of FIG. 2A;

FIG. 3 illustrates an exploded view of the embodiment of FIG. 2;

DETAILED DESCRIPTION OF THE EMBODIMENTS

Figure 1:
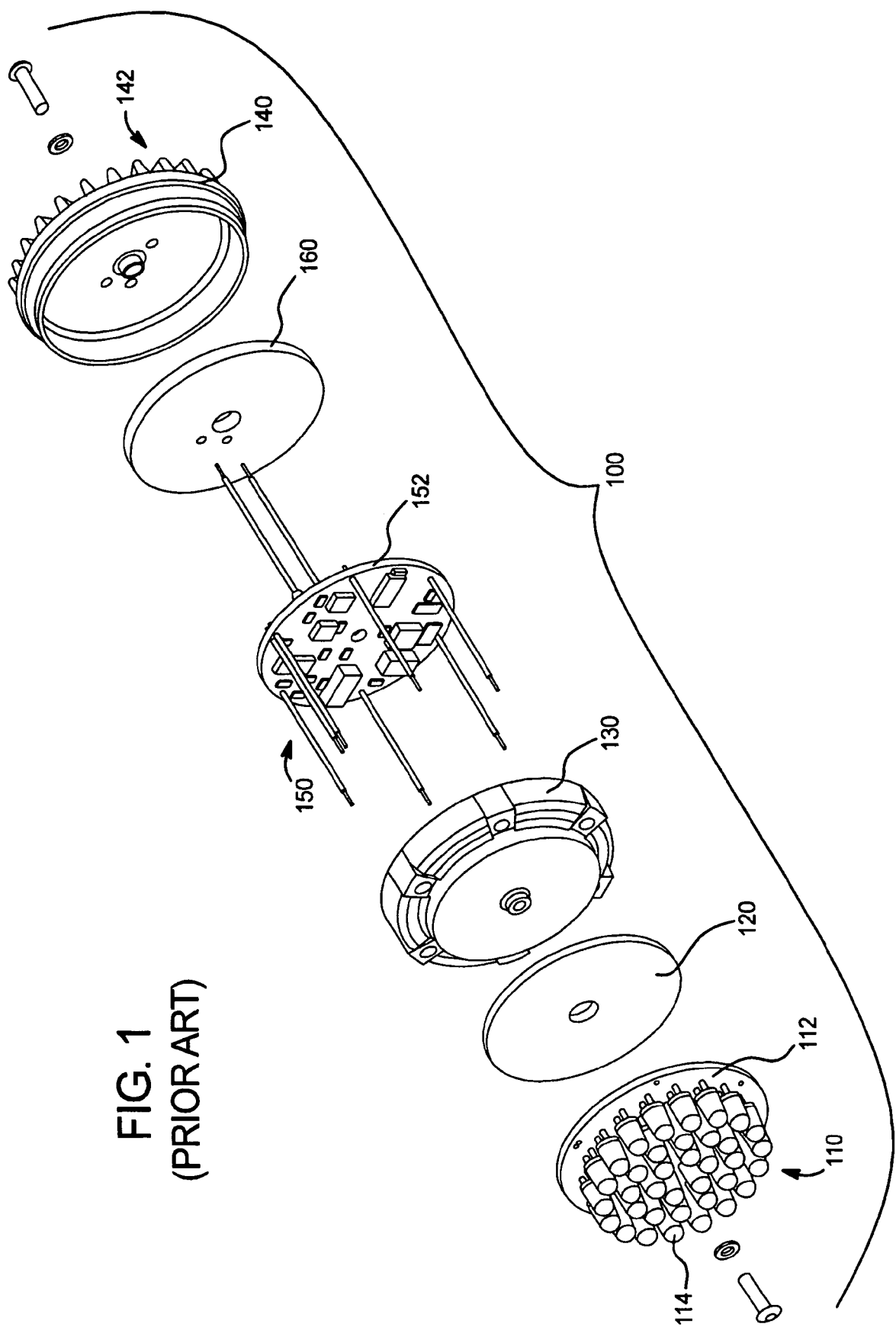
FIG. 1 illustrates an exploded view of a conventional LED lighting apparatus.
Figure 2:
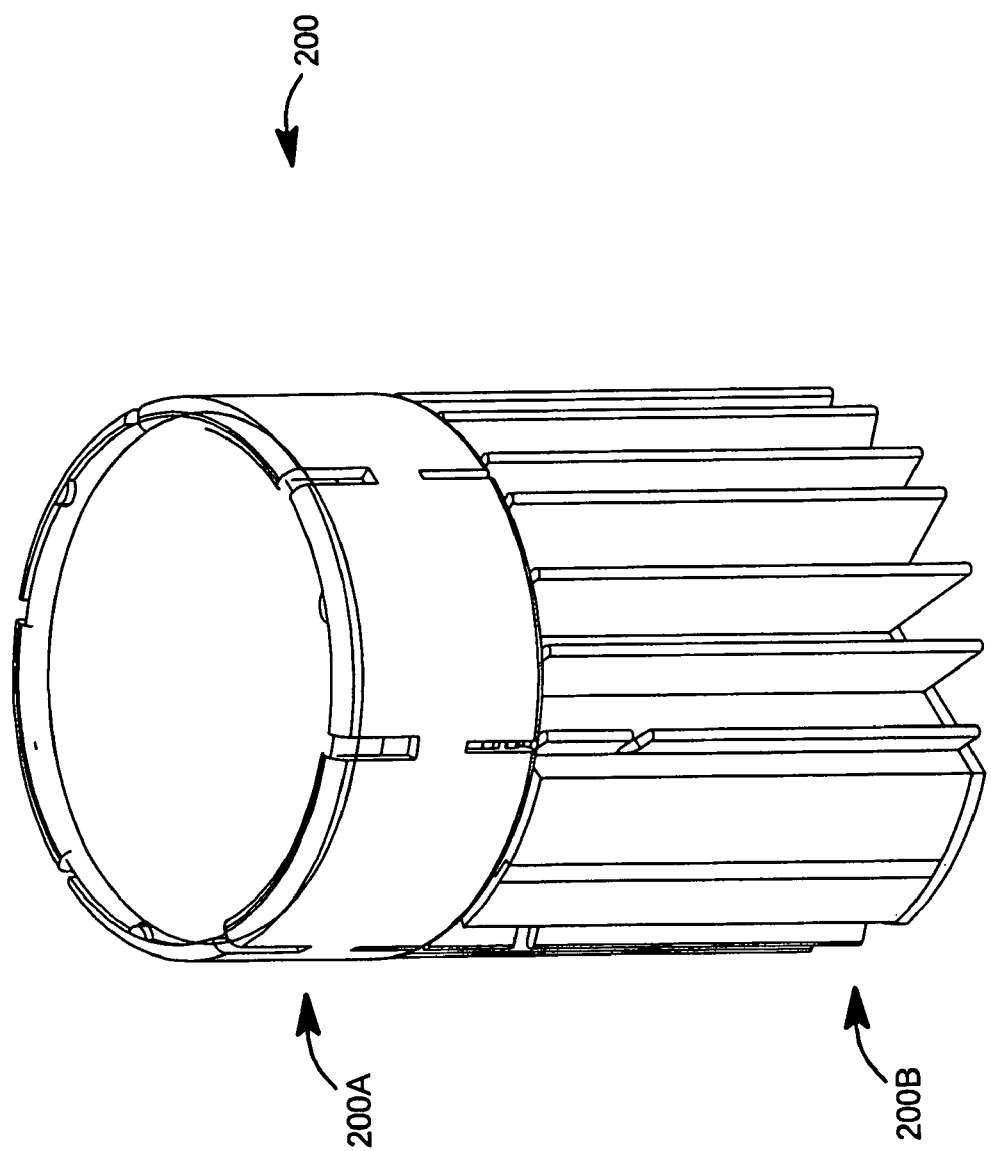
FIG. 2 illustrates a perspective view of an embodiment of an LED lighting apparatus.
Figure 2C:
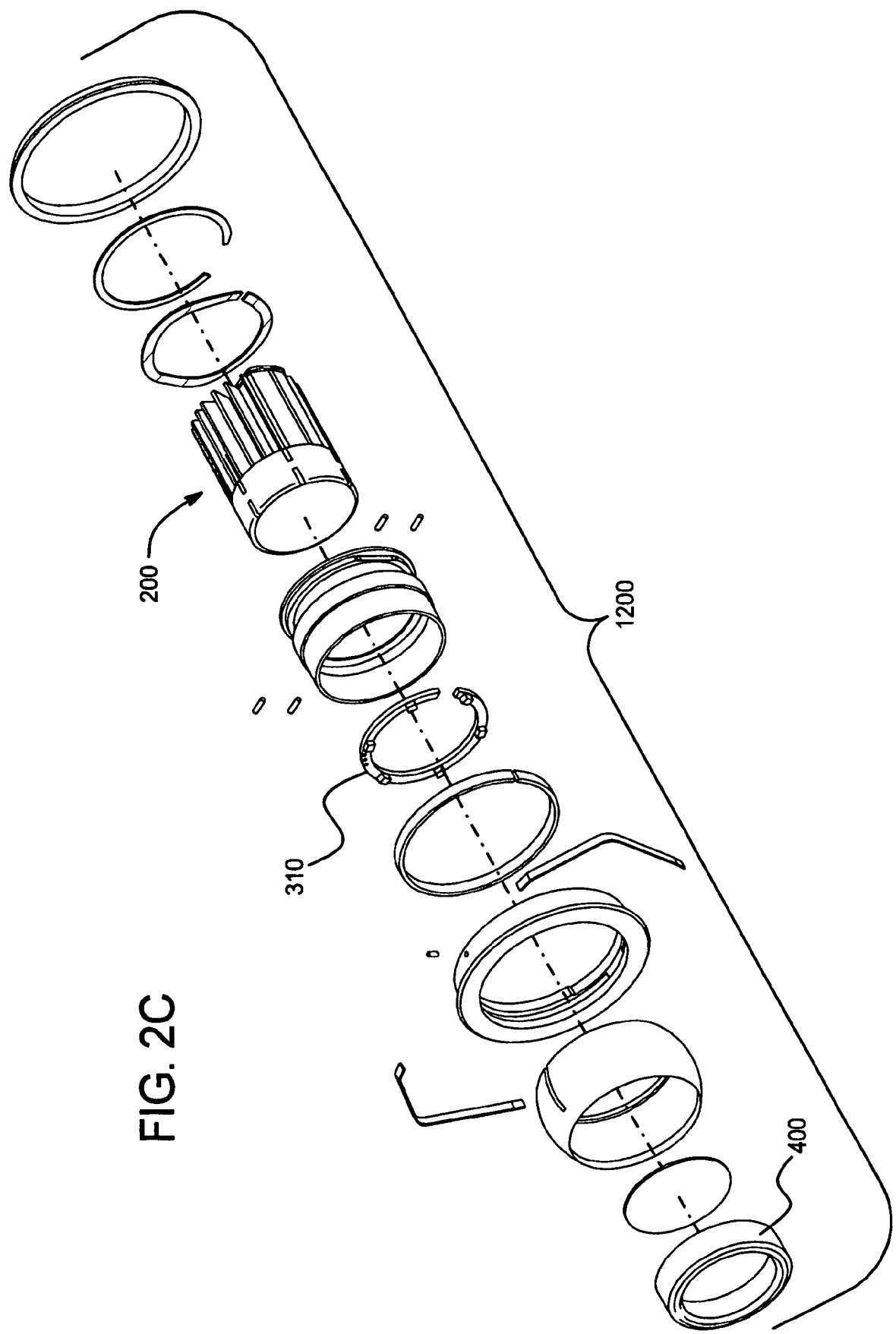
FIG. 2C illustrates an exploded view of the example lighting fixture of FIG. 2A.

Referring now to the Figures, an LED lighting apparatus is described. Although the subject LED lighting apparatus may be used for a reading light fixture in vehicles such as cars, vans, busses, trains and aircraft for illuminating the vehicle interior, one can appreciate that the subject LED lighting apparatus can be used in other lighting fixtures and environments, for example, in residences, offices, libraries and other locations where individuals require illumination to read, work, etc. Although the LED lighting apparatus may be used for task lighting, it is not limited as such and may be used for accent lighting, as a decorative spotlight or the like. As shown in FIG. 2, one embodiment of an LED lighting apparatus 200 is configured to be generally cylindrical in shape, however, the LED lighting apparatus 200 may be configured differently. As shown, the LED lighting apparatus 200 includes a first portion 200A and a second portion 200B. As will be explained hereinafter in further detail, the first portion 200A includes a plurality of LEDs, which provide a controllable illumination, and the second portion 200B provides a thermal dissipation mechanism to extend the lifespan of the apparatus 200 by preventing overheating thereof. The LED lighting apparatus 200 is generally compact and, in one embodiment, has a diameter of about 1.5 inches and a length of about 2.4 inches. As can be appreciated, the LED lighting apparatus 200 may be adapted to various light fixtures. Referring to FIGS. 2A-2C, one example light fixture employing the LED lighting apparatus 200 is illustrated. As shown in FIGS. 2A-2C, the LED lighting apparatus 200 may be employed for a moveable ball reading light 1200, however, the LED lighting apparatus 200 may be used with other lighting fixtures including a stick light as well as other fixtures that are known in the art.

Referring now to FIG. 3, the LED lighting apparatus 200 is described in further detail. As shown in FIG. 3, the LED lighting apparatus 200 comprises the controllable-illumination first portion 200A that includes a lens holder 210, an outer lens 220, a one-piece lens array 230 and an LED circuit board 240. Furthermore, as illustrated the LED lighting apparatus 200 comprises the thermal-dissipation second portion 200B that includes a plurality of thermal pads 250, 285, 295, an interface plate 260, a control circuit board 270, a heat exchanger 280, a rear seal 290 and a rear cover 292. As shown, the lens holder 210 is generally annular in shape and, as can be appreciated, the outer lens 220, the one-piece lens array 230 and the LED circuit board 240 are disposed within the lens holder 210. Furthermore, the two thermal pads 250 sandwiching the interface plate 260 may additionally be disposed, at least partially within the lens holder 210. The outer lens 220 is generally circular in shape and may be made of any suitable transparent or translucent optical material, for example, glass, plastic, polycarbonate, etc. The one-piece lens array 230 is generally concave in shape and, as illustrated, includes six lenses, but fewer or additional lenses may be included to correspond with the quantity of LEDs on the LED circuit board 240. As shown, the LEDs on the LED circuit board 240 are surface-mount LEDs, however, in other embodiments, the LEDs may alternatively be through-hole mounted LEDs. Since the surface-mount LEDs emit light with a wide angle of dispersion, each lens of the one-piece lens array 230 is aligned with one of the LEDs on the LED circuit board 240 to focus/collimate light emitted from the plurality of LEDs into a continuous light pattern.

As shown, fasteners 202 (e.g., screws, bolts, etc.) and washers 204 may be used to connect the LED circuit board 240 together with the circular thermal pads 250, the interface plate 260 and the heat exchanger 280 so that heat generated by the plurality of LEDs on the LED circuit board 240 is transferred away from the LED circuit board 240. Each thermal pad of the plurality of thermal pads 250, 285, 295 may be made of a suitable material that is known in the art. One example material, Gap Pad® 1500 that is available from the Bergquist Company of Chanhassen Minn., may be used for one or more of the thermal pads 250, 285, 295, however, other suitable materials that may be selected include adhesives, potting material and the like. As can be appreciated, the thermal pads 250 and interface plate 260 are substantially similar to the LED circuit board 240 in size and shape to maximize heat transfer from the LED circuit board 240 to the heat exchanger 280. Furthermore, the thermal pad 250 proximate the control circuit board 270 is in direct contact with a top surface of the heat exchanger 280. Thus, a short thermal path is provided from the LED circuit board 240, to the adjacent thermal pad 250, to the interface plate 260, to the other thermal pad 250, and finally to the heat exchanger 280 so that heat generated by the LEDs may be quickly transferred and dissipated.

Furthermore, as shown, each of the LED circuit board 240, thermal pads 250 and interface plate 260 includes at least one slot into which a portion of the control circuit board 270 is received. As illustrated, each of the LED circuit board 240, thermal pads 250 and interface plate 260 is configured to be generally circular so that the at least one slot is configured as two diametrically opposed, radially extending slots. However the at least one slot may be configured otherwise. As shown, the control circuit board 270 is generally rectangular in shape and includes two spaced-apart projections that are configured to mechanically engage with the two diametrically opposed, radially extending slots so that, when the projections are engaged in the slots, the LED circuit board 240 and control circuit board 270 are substantially perpendicular to each other. As shown, the control circuit board 270 and a plurality of thermal pads are disposed within an interior cavity of the heat exchanger 280. As shown, the plurality of thermal pads comprises four thin thermal pads 285, which are configured such that two thin thermal pads are disposed on either generally planar side of the control circuit board 270, and one thick thermal pad 295. In other embodiments, the plurality of thermal pads may be configured otherwise. The plurality of thermal pads contacts the control circuit board 270 so that a short thermal path is provided from the control circuit board 270 to the heat exchanger 280. In this way, the control circuit board 270 and the LED circuit board 240 both achieve efficient access to the heat exchanger 280.

As can be appreciated, the heat exchanger 280 may be comprised of one or more thermally-conductive materials known in the art, for example, aluminum, an aluminum alloy, and the like, which additionally are advantageously light weight. The heat exchanger 280 may be formed by various processes known in the art, for example, machining, extruding, casting and the like. However, in one embodiment, the heat exchanger 280 is preferred to be extruded aluminum parts due to low cost, thermal conductivity and light weight. Although two substantially similar heat exchanger portions 280 are illustrated in FIG. 3, fewer or additional portions may be provided. For example, the heat exchanger may be one-piece. The heat exchanger 280 as shown includes a plurality of fins, however, the heat exchanger 280 is not limited as such. In other embodiments, the heat exchanger may be a thermally conductive device or object such, for example, a liquid-cooled plate. A rear seal 290 (e.g., made of silicone or the like) and a rear cover 292 are configured to substantially close the bottom of the interior cavity of the heat exchanger 280. As further shown in FIG. 3, a grommet 282 (e.g., made of silicone or the like) may be configured in an aperture in the heat exchanger 280 and provide a substantially sealed passage for wires, cables or the like to electrically connect one or more of the LED circuit board 240 and the control circuit board 270 with an electronic control unit, cabin control system or the like. The rear cover 290, as shown, is connected to the heat exchanger 280 by fasteners 202 (e.g., screws, bolts, etc.), which are received in holes of the heat exchanger 280. Furthermore, the LED circuit board 240, interface plate 260 and two thermal pads 250 sandwiching the interface plate 260 are connected to the heat exchanger 280 by way of washers 204 and fasteners 202 (e.g., screws, bolts, etc.), which are received in holes of the heat exchanger 280.

Figure 4A:
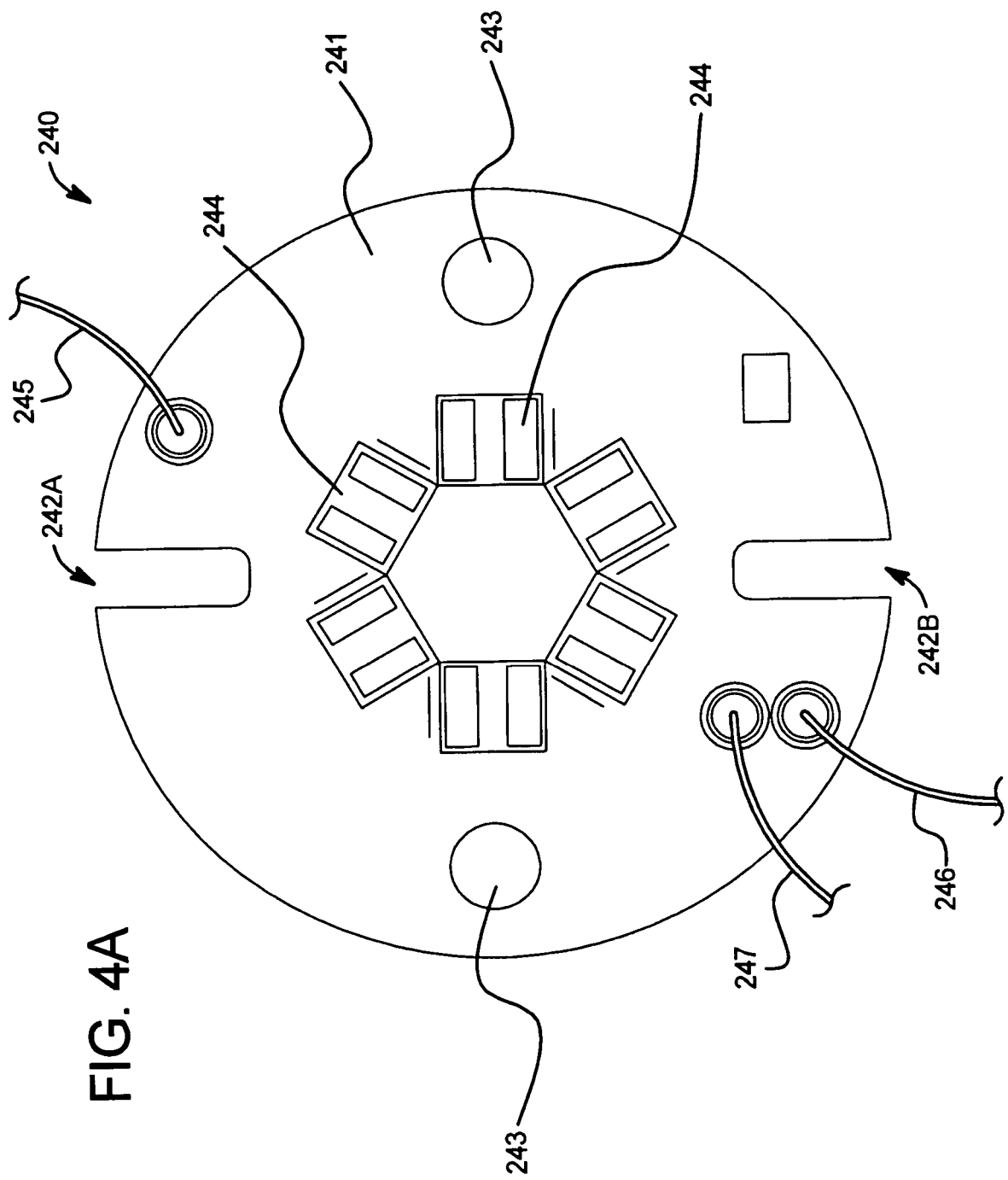
FIG. 4A illustrates a plan view of an LED circuit board of the embodiment of FIG. 2.
Figure 4B:
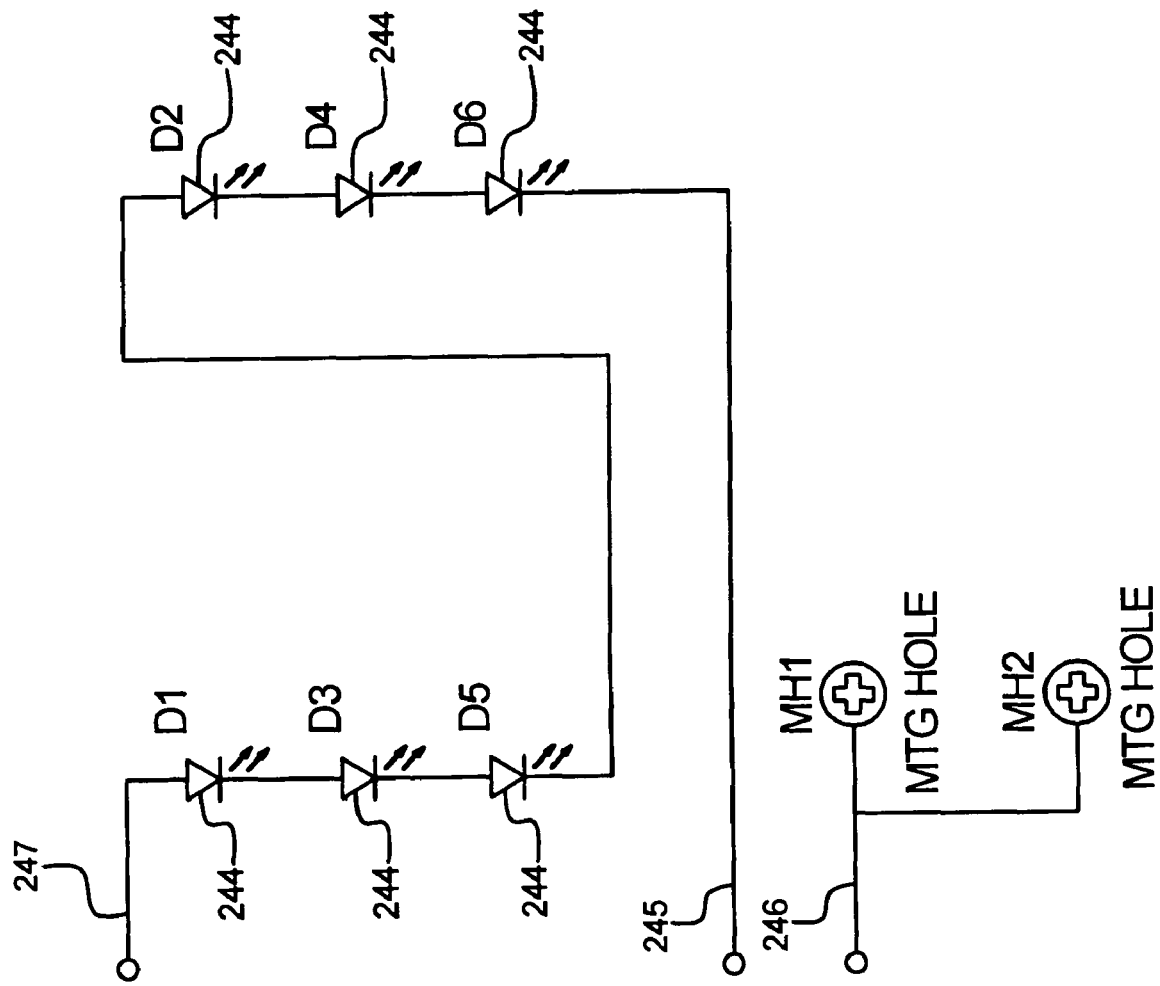
FIG. 4B illustrates a schematic for the LED circuit board of FIG. 4A.

Referring now to FIGS. 4A and 4B, the LED circuit board 240 is described in further detail. As shown in FIG. 4A, the illustrated LED circuit board 240 is generally circular in shape and includes a circuit substrate or board 241, for example, a PCB with printed circuit traces (not shown) on at least one surface. As can be appreciated from FIG. 4B, the printed circuit traces interconnect the plurality of LEDs 244 and, further, connect the plurality of LEDs 244 with wires 245, 247 (e.g., jumpers) to interface the plurality of LEDs 244 with the control circuit board 270 (FIG. 3). As illustrated, six LEDs 244 are provided and configured in a ring so that LEDs are equally spaced or separated (e.g., adjacent LEDs are separated by an angle of about sixty degrees with respect to the center of the board 241 such that a central hexagonal region is defined). However, fewer or additional LEDs may be provided and arranged otherwise. The board 241 includes two slots 242A, 242B that extend radially along a common diameter and are diametrically opposed. Although two slots 242A, 242B are illustrated, fewer or additional slots may be provided and configured otherwise. Furthermore, the board 241 includes two apertures 243 that are diametrically opposed and configured to receive fasteners therethrough to secure the LED circuit board 240 to the thermal pads 250, interface plate 260 and heat exchanger 280 as shown in FIG. 3. As further illustrated in FIG. 4A, the LED circuit board 240 includes a plurality of LEDs, in one embodiment, preferably surface-mount LEDs 244, for example, a high-output surface-mount LED available from Nichia Corporation of Japan or the like. Although surface-mount LEDs are preferred in one embodiment of the LED light apparatus 200 due to low cost and lower power consumption, through-hole mounted LEDs may alternatively be employed.

Figure 5B:
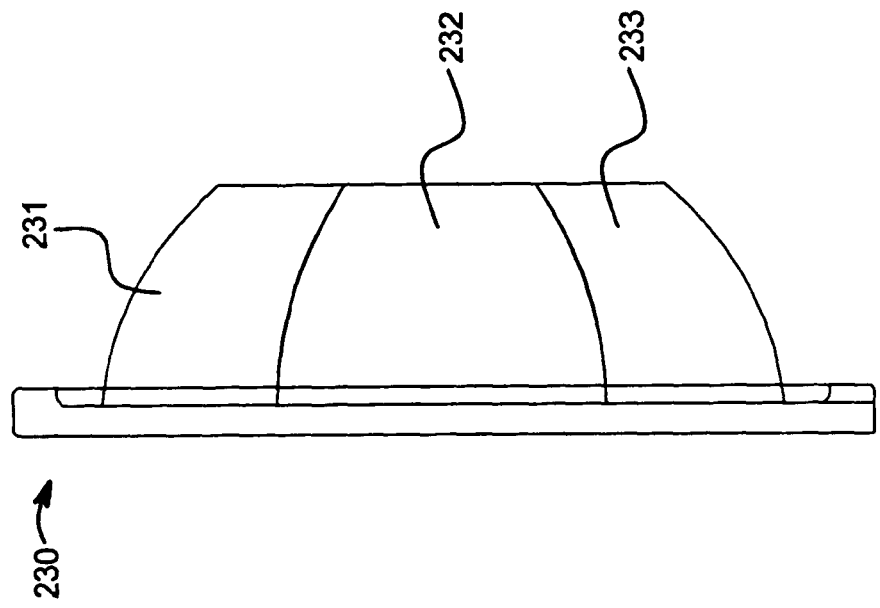
FIG. 5B illustrates an elevation view of the one-piece lens array of FIG. 5A.
Figure 5A:
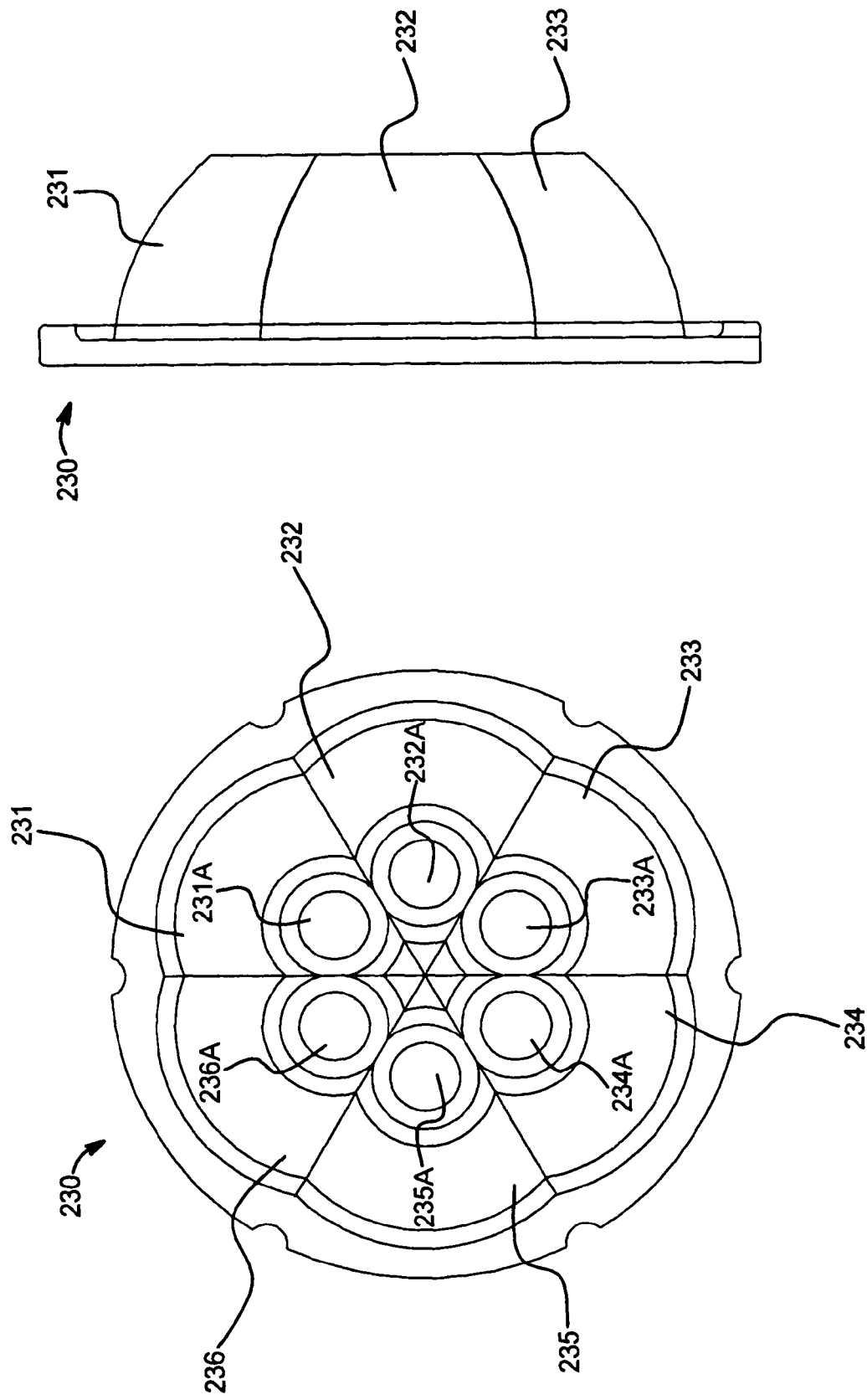
FIG. 5A illustrates a plan view of a one-piece lens array of the embodiment of FIG. 2.

Referring now to FIGS. 5A and 5B, the one-piece lens array 230 is described. As can be appreciated from FIGS. 5A and 5B, the one-piece lens array 230 is generally circular and concave in shape, but may be configured otherwise. As best illustrated in FIG. 5A, the array 230 includes six generally pie-shaped lens sections 231, 232, 233, 234, 235 and 236 to substantially correspond with the quantity of LEDs provided in the plurality of LEDs 244 (FIGS. 4A and 4B), but fewer or additional lens sections may be provided. The six generally pie-shaped lens sections 231, 232, 233, 234, 235 and 236 may be unitary and integrally formed, for example, by molding, such that the array 230 is one-piece. As shown, each of the lens sections 231, 232, 233, 234, 235 and 236 includes a transparent or translucent lens 231A, 232A, 233A, 234A, 235A and 236A, respectively. The lenses 231A, 232A, 233A, 234A, 235A and 236A are configured in a ring so that adjacent lenses are arcuately separated by an angle of about sixty degrees with respect to the center of the array 230 such that each lens of the plurality of lenses 231A, 232A, 233A, 234A, 235A, 236A may be aligned with each LED of the plurality of LEDs 244 for focusing and/or collimating light emitted from the plurality of LEDs 244 to provide an integral, continuous light pattern from the LED lighting apparatus 200. Partial-annular shaped areas of each of the lens sections 231, 232, 233, 234, 235 and 236 (i.e., the areas between the lenses 231A, 232A, 233A, 234A, 235A, 236A and the perimeter of the array 230) may be reflective to provide additional focused illumination from the surface-mount LEDs, which emit light with a wide dispersion angle.

Figure 6A:
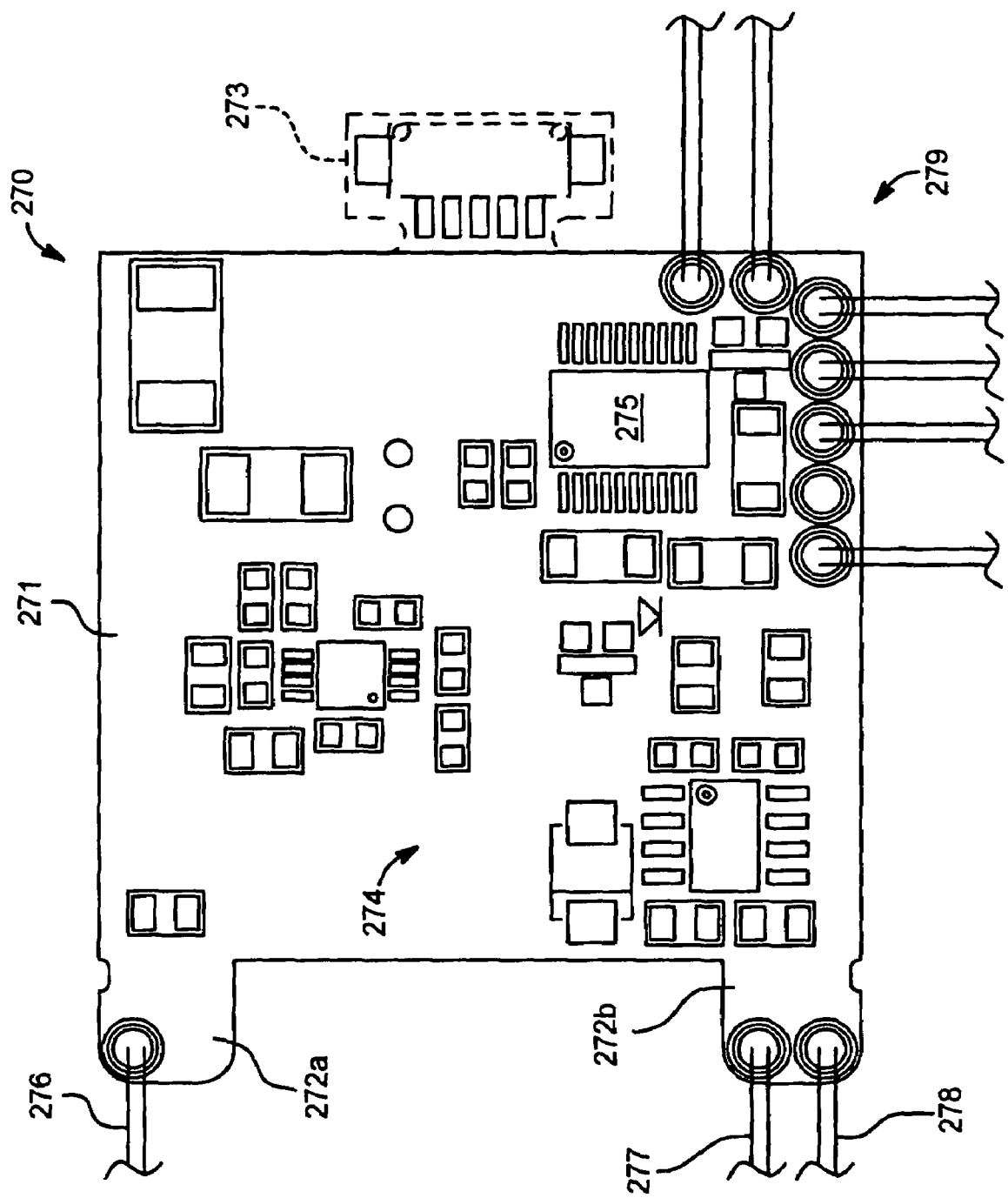
FIG. 6A illustrates a plan view of a control circuit board of the embodiment of FIG. 2.
Figure 6B:
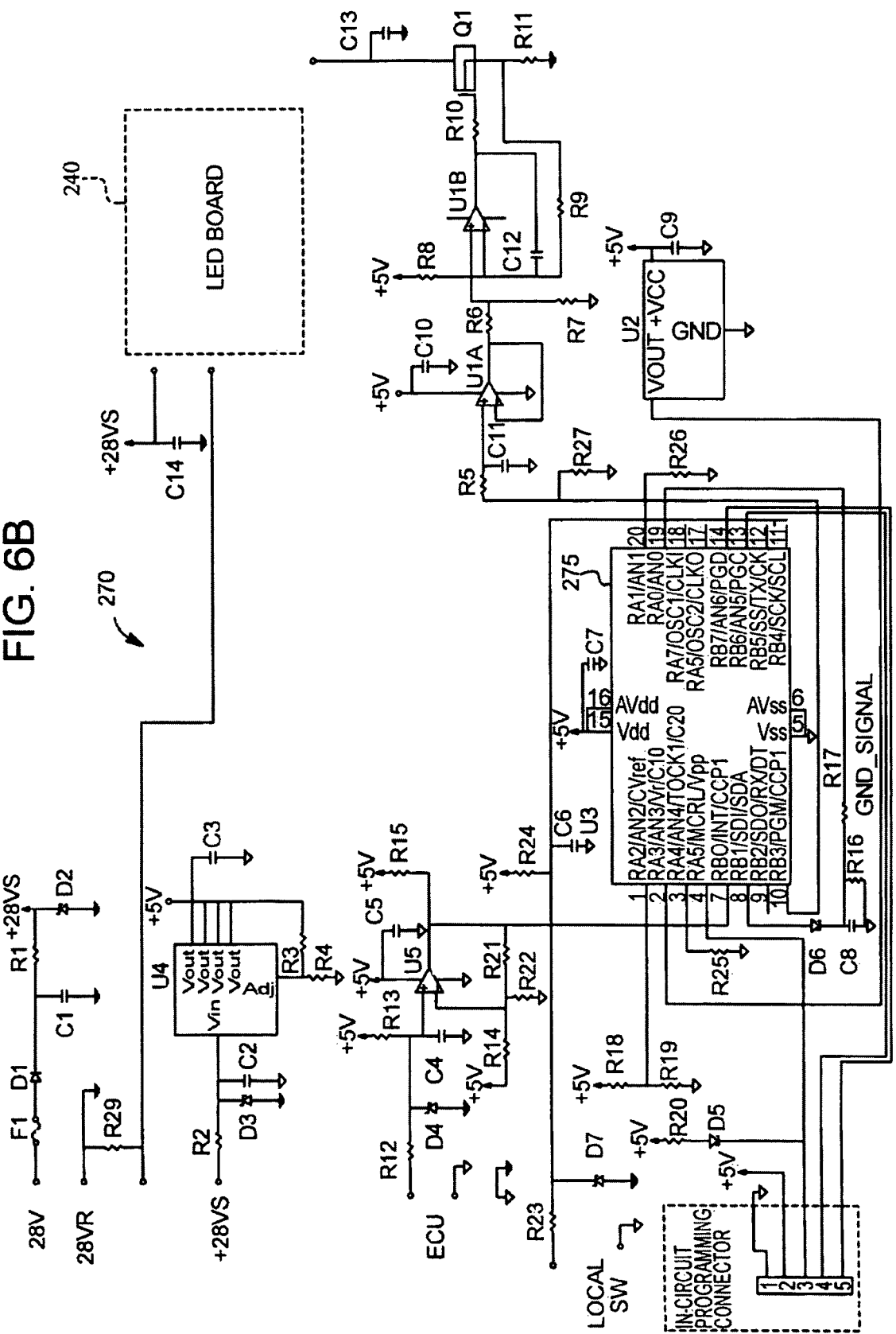
FIG. 6B illustrates a schematic for the control circuit board of FIG. 6A.

Referring now to FIGS. 6A and 6B the control circuit board 270 is described in further detail. As shown in FIG. 6A, the control circuit board 270 is generally rectangular in shape and includes a body portion 271, for example, a PCB with printed circuit traces (not shown) on at least one surface, and two projections 272A, 272B that extend from an edge of the body portion 271. The two projections 272A, 272B are spaced apart along the edge such that they are configured to engage with the slots 242A, 242B (FIG. 4A). Projections 272A and 272B facilitate electrical connectivity between components on the body portion 271 and components on the board 241. Although two projections 272A, 272B are illustrated, fewer or additional projections (i.e., at least one projection) may be provided or configured otherwise relative to the configuration of the at least one slot of the LED circuit board 240. As further shown on FIG. 6A, there are a plurality of electronic components 274 mounted on the body portion and configured to control operation of the LED circuit board 240 by a microprocessor as shown or by other digital or analog circuits. For the embodiment shown in FIG. 6B, the processor 275 may be an integrated circuit (IC) microprocessor or microcontroller, for example, the PIC16F88 available from Microchip Technology Inc. However, the processor 275 may be other devices known in the art, such as, for example, a programmable logic controller (PLC), a field programmable gate array (FGPA), a state machine or the like.

As can be further appreciated from FIG. 6B, the printed circuit traces on the body portion 271 interconnect the plurality electronic components 274 (FIG. 6A) and, further, connect the plurality of components 274 with wires 276, 277 and 278 (e.g., jumpers) to interface the plurality of components 274 and processor 275 with the plurality of LEDs 244 on the LED circuit board 240 for powering illumination of the plurality of LEDs 244. Moreover, the printed circuit traces on the body portion 271 interconnect the plurality electronic components 274 (FIG. 6A) and the processor 275 with a plurality of wires 279 (e.g., jumpers) that interface the control circuit board 270 with a user interface or input device (not shown) for receiving a user-actuated control signal. As known in the art, a user input device such as a switch, keyboard, electronic control unit, cabin control system and the like may be employed to provide a user input signal to the control circuit board 270. Furthermore, a combination of two or more of the foregoing exemplary input devices may be employed as well. For example, in an aircraft, the input device may be an actuator (e.g., snap-dome button, contact microswitch, etc.) that is located proximate an overhead reading light assembly in which the LED lighting apparatus 200 is disposed and/or distal from the apparatus 200 on a passenger armrest as a part of the passenger service system (PSS) that includes other actuators for attendant call, controlling in-flight music station and volume. In another example, one or more input devices may be part of an electronic control unit or cabin control system that may be actuated by an attendant or a cockpit crewmember.

As can be appreciated, the user input device is configured to provide one or more signals to the processor 275 or control circuitry for varying the state of the plurality of LEDs 244 of the LED circuit board 240. In one embodiment, the processor 275 is configured to detect a momentary switch to ground signal from the input device for switching the plurality of LEDs 244 between an on state, an off state and one or more intermediate (i.e., dim) states. For example, a user may actuate the input device a number of times to cycle the light intensity emitted by apparatus 200 between a fully-bright on state, an off state and at least one dim state with a light intensity between the fully-bright on state and the off state. In this way, a user may selectively dim the output according to the number of times the input device is actuated. In another example, the input device may include a first actuator (e.g., a button or switch) that sends a first signal to the processor 275 for turning the plurality of LEDs 244 on and off, and a second actuator (e.g., a dial rheostat or potentiometer) that sends a second signal to the processor 275 for continuously or discretely (i.e., stepwise) varying the illumination intensity of the plurality of LEDs 244 once it is turned on according to the first signal. As such, a user may be able to ramp the illumination intensity up and down to customize the light output of the LED lighting apparatus 200 to their liking. Indeed, a person of skill in the art will appreciate that the control circuit board 270 and processor 275 may be configured in various ways to vary or otherwise control the illumination intensity emitted from the LED circuit board 240 according to a user input signal from a user input device. As further known in the art, the processor may selectively control the illumination by turning on and off one or more individual LEDs. Alternatively, the processor 275 may vary at least one of voltage and current (e.g., a PWM output) provided to the LED circuit board 240.

As shown in FIGS. 6A and 6B, the control circuit board may optionally include an in-circuit serial programming (ICSP) interface 273 that is connected with the processor 275 for initial loading and/or programming of firmware on the processor 275. After loading the firmware on the processor 275, the ICSP interface 273 may be removed, if desired. In some embodiments, an end-user of the apparatus 200 may field-load user, application or context/environment specific firmware on the processor 275 or upgrade firmware as necessary via the ICSP interface 273.

Figure 7A:
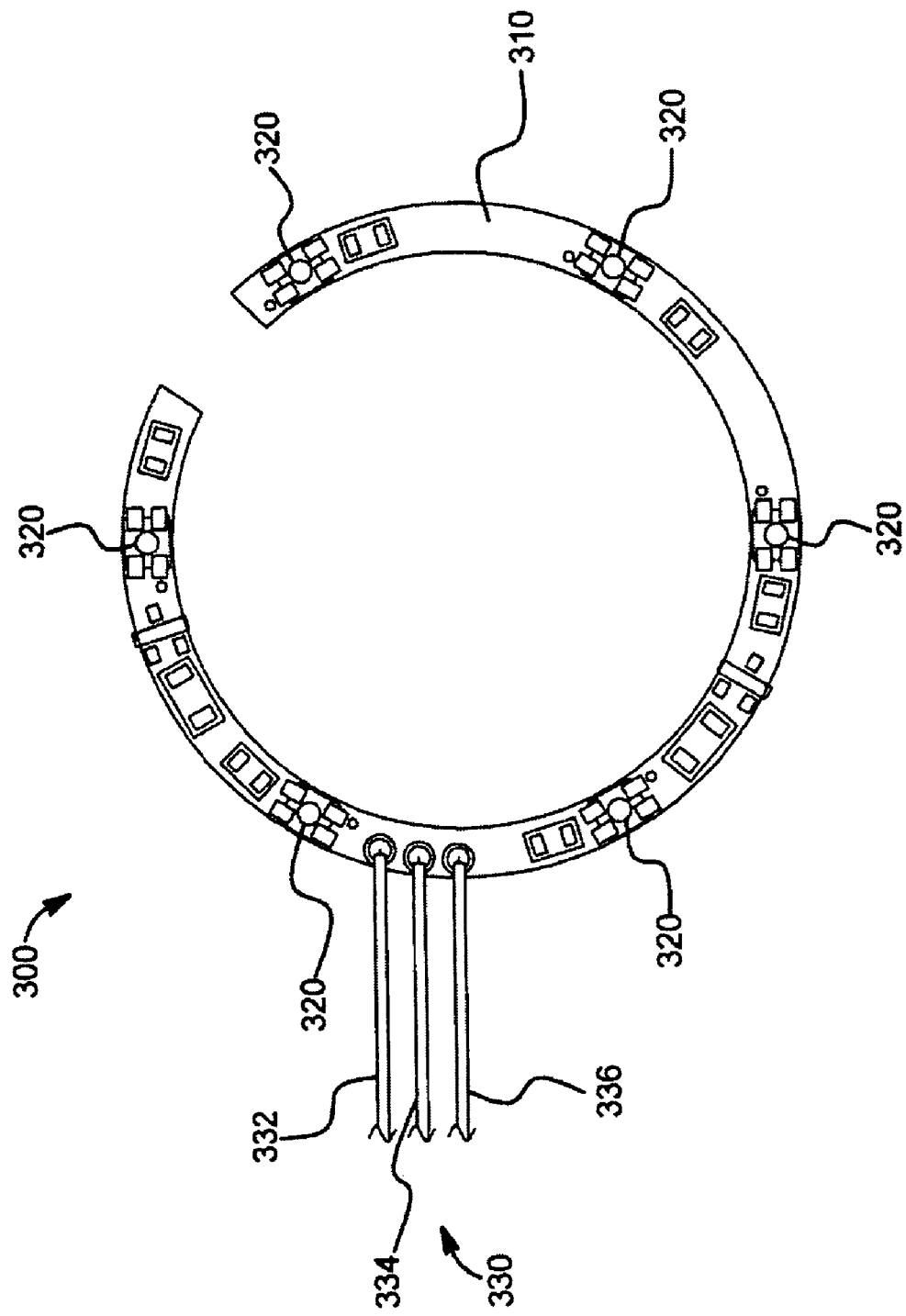
FIG. 7A illustrates a plan view of an example emergency lighting LED circuit board for use with the embodiment of FIG. 2.
Figure 7B:
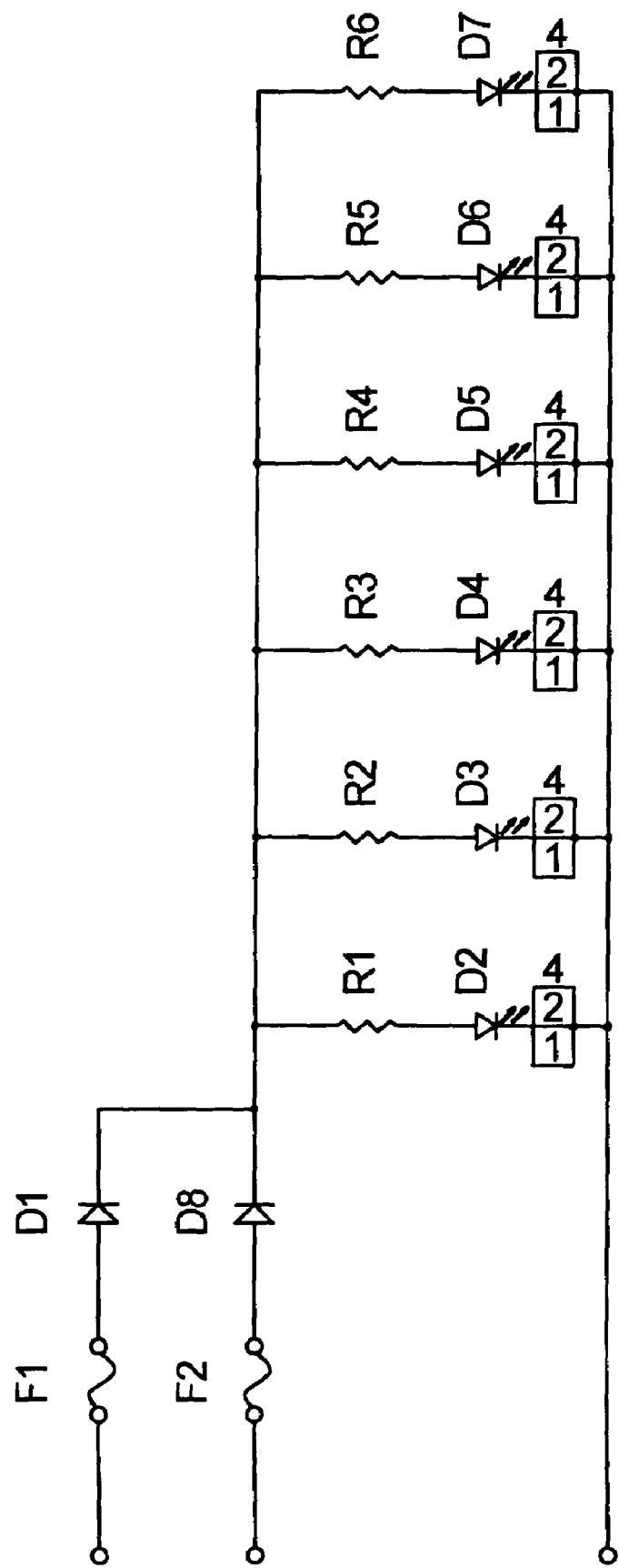
FIG. 7B illustrates a schematic for the example emergency lighting LED circuit board of FIG. 7A.
Figure 8A:
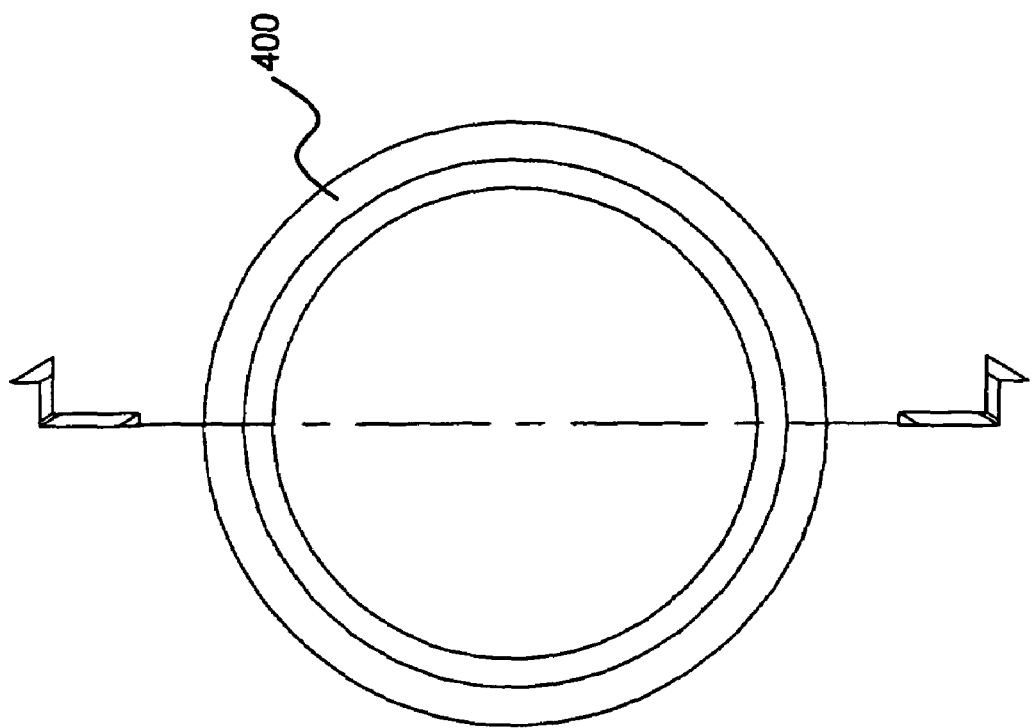
FIG. 8A illustrates a plan view of an example light pipe for use with the example emergency lighting LED circuit board of FIG. 7A.

Referring now to FIGS. 2B, 2C, 7A, 7B, 8A and 8B, an optional emergency lighting module is described. The emergency lighting module 300 (FIG. 2B) includes emergency lighting circuit board 310 and light pipe 400. As shown in FIGS. 2C, 7A and 8A, the emergency lighting circuit board 310 and the light pipe 400 are both generally annular in shape. Furthermore, as shown, the emergency lighting circuit board 310 is configured as a generally C-shaped, narrow ring with an inner circumference and an outer circumference. Referring to FIG. 2B, the inner circumference of the board 310 is slightly larger than the outer circumference of the LED lighting apparatus 200, particularly the first portion 200A (FIG. 2). Furthermore, the outer circumference of the board 310 is slightly smaller than the inner circumference or bore of the lighting fixture 1200. In this way, the board 310 is configured to substantially surround the LED lighting apparatus 200 without significantly increasing the diameter of the fixture 1200. That is, the emergency lighting module 300 may be included in the lighting fixture 1200 while keeping the lighting fixture 1200 generally compact and not substantially larger than the LED lighting apparatus 200. In other embodiments, the LED lighting apparatus 200 may be configured such that the emergency lighting circuit board 310 and light pipe 400 may fit within the upper portion 200A (FIG. 2) or lens holder 210 (FIG. 3).

Referring to FIGS. 7A and 7B, the circuit substrate or board 310, for example, a PCB, includes circuit traces, for example, printed traces (not shown) on at least one surface. As can be appreciated from FIG. 7B, the circuit traces interconnect the plurality of LEDs 320 (FIG. 7A), which are indicated as LEDs D2-D7 and, further, connect the plurality of LEDs 320 with a plurality of wires 332, 334, 334 (e.g., jumpers). In one embodiment, the LEDs of the plurality of LEDs 320 are preferably surface-mount LEDs, for example, high-output surface-mount LEDs available from Nichia Corporation of Japan or the like. Although surface-mount LEDs are preferred for the emergency lighting circuit board 300 in one embodiment of the LED light apparatus 200 due to low cost and lower power consumption, through-hole mounted LEDs may alternatively be employed. As best illustrated in FIG. 7A, six LEDs 320 are provided and configured in a ring so that adjacent LEDs are arcuately separated by an angle of about sixty degrees with respect to the center of the board 310. However, fewer or additional LEDs 320 may be provided and arranged otherwise. Moreover, as shown in FIG. 7B, the plurality of LEDs 320 (comprising LEDs D2-D7) are connected in parallel, but alternatively may be connected in series as are the plurality of LEDs 244 (FIG. 4B)

As can be appreciated the plurality of wires 332, 334, 336 provide an interface 330 between the plurality of LEDs 320 and the control circuit board 270 (FIG. 3) for illuminating the plurality of LEDs 320 during instances of momentary or sustained interruption of a primary or normal power source that normally energizes the plurality of LEDs 244. The cabin control system or equivalent will apply 6 VDC and 6 V return to interface 330 (wires 332, 334) when there is a loss of cabin lighting.

Figure 8B:
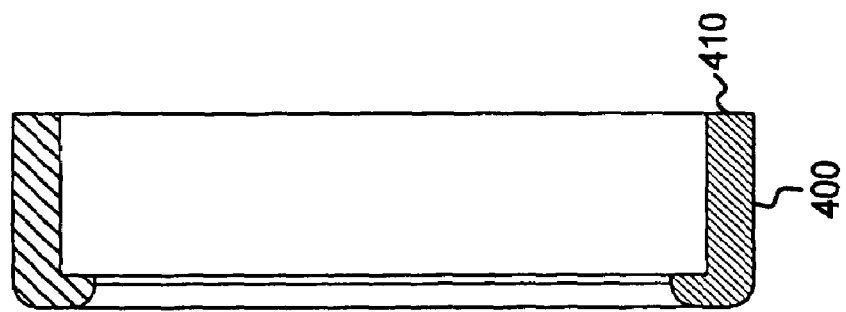
FIG. 8B illustrates a section view of the example light pipe of FIG. 8A.

Referring now to FIGS. 2B, 8A and 8B, a light pipe 400 is provided to aggregate light emitted from the plurality of LEDs 320 and emit a continuous light pattern. As shown in FIG. 8A, the light pipe 400 is configured as a narrow ring to substantially correspond with the configuration of emergency lighting circuit board 310. As shown in FIG. 8B, the light pipe 400 includes an elongated, annular body with an inner circumference and an outer circumference. The elongated, annular body includes a substantially planar bottom surface 410, which may be optically polished, and a top portion that extends generally perpendicular and inward from the body. The substantially planar surface 410 is configured to be disposed proximate to the plurality of LEDs 320 so that light emitted from the plurality of LEDs 320 is received by the substantially planar surface 410 and channeled through the elongated, annular body for emission at the upper portion in a circular pattern. As shown in FIG. 2B, the light pipe 400 is configured so that the inner circumference of the elongated, annular body abuts the outer circumference of the lens holder 210 of first portion 200A (FIG. 2). Furthermore as shown, the upper portion of light pipe 400 wraps around the top of the lens holder 210 and extends slightly inward, toward the center of the lens holder 210.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. A lighting apparatus comprising:
   a lens array including a plurality of lenses;
   a first circuit board including a plurality of LEDs, each LED of the plurality of LEDs being aligned with a lens of the plurality of lenses; and
   a second circuit board electrically connected with the first circuit board to control illumination of the plurality of LEDs, the second circuit board configured to mechanically engage with the first circuit board,
   and wherein the first circuit board is oriented substantially perpendicular to the second circuit board.

2. The lighting apparatus of claim 1 wherein the first circuit board is generally circular and includes at least one slot, the plurality of LEDs being equally spaced arcuately in a ring about the center of the first circuit board.

3. The lighting apparatus of claim 2 wherein the second circuit board includes a body portion and at least one projection extending from an edge of the body portion and substantially parallel to the body portion.

4. The lighting apparatus of claim 3 wherein the at least one slot comprises two diametrically opposed, radial slots.

5. The lighting apparatus of claim 4 wherein the at least one projection comprises two projections spaced apart along the edge, the two projections configured to engage with the two diametrically opposed radial slots.

6. The lighting apparatus of claim 1 wherein the second circuit board is configured to receive a control signal from a user interface and control a light intensity of the plurality of LEDs according to the control signal.

7. The lighting apparatus of claim 1 wherein the plurality of lenses are integrally formed.

8. The lighting apparatus of claim 1 further comprising a heat dissipation assembly comprising:
   a first thermal pad configured on a side of the first circuit board opposite the plurality of LEDs;
   at least one second thermal pad configured on at least one side of the body portion; and
   a heat exchanger including an interior cavity and a plurality of exterior fins, the interior cavity configured to substantially encompass the body portion and dissipate heat from the first thermal pad and the at least one second thermal pad.

9. The lighting apparatus of claim 1 further comprising:
   a third circuit board including a second plurality of LEDs; and
   a light pipe configured to receive light from the second plurality of LEDs, wherein the second circuit board is connected with the third circuit board to power the second plurality of LEDs independently from the plurality of LEDs.

10. The lighting apparatus of claim 2 further comprising:
    a generally annular third circuit board including a second plurality of LEDs, the generally annular third circuit board substantially surrounding a circumference of the lighting apparatus; and
    a generally annular light pipe configured to receive light from the second plurality of LEDs, wherein the second circuit board is connected with the generally annular third circuit board to power the second plurality of LEDs independently from the plurality of LEDs.

11. A lighting apparatus comprising:
    a one-piece lens array including a plurality of lenses;
    a first circuit board including at least one slot and a plurality of LEDs on a first surface, each LED of the plurality of LEDs being aligned with a lens of the plurality of lenses;
    a first thermal pad configured on a second surface of the first circuit board;
    a second circuit board connected with the first circuit board to power illumination of the plurality of LEDs, the second circuit board including a body portion and at least one projection extending from an edge of the body portion, the body portion being substantially perpendicular to the first circuit board when the at least one projection is engaged in the at least one slot;
    at least one second thermal pad configured on at least one side of the body portion; and
    a heat exchanger including an interior cavity, the interior cavity configured to substantially encompass the body portion and dissipate heat from the first thermal pad and the at least one second thermal pad.

12. The lighting apparatus of claim 11 wherein the first circuit board is generally circular, the plurality of LEDs being equally spaced arcuately in a ring about the center of the first circuit board.

13. The lighting apparatus of claim 12 wherein the plurality of LEDs comprise at least six LEDs.

14. The lighting apparatus of claim 13 wherein the at least six LEDs comprise surface-mount LEDs.

15. The lighting apparatus of claim 12 wherein the at least one slot comprises two diametrically opposed, radial slots.

16. The lighting apparatus of claim 15 wherein the at least one projection comprises two projections spaced apart along the edge, the two projections configured to engage with the two diametrically opposed radial slots.

17. The lighting apparatus of claim 11 wherein the second circuit board is configured to receive a control signal from a user interface and control a light intensity of the plurality of LEDs according to the control signal.

18. The lighting apparatus of claim 11 further comprising:
    a third circuit board including a second plurality of LEDs; and
    a light pipe configured to receive light from the second plurality of LEDs, wherein the second circuit board is connected with the third circuit board to power the second plurality of LEDs independently from the plurality of LEDs.

19. The lighting apparatus of claim 12 further comprising:
    a generally annular third circuit board including a second plurality of LEDs, the generally annular third circuit board substantially surrounding a circumference of the lighting apparatus; and
    a generally annular light pipe configured to receive light from the second plurality of LEDs, wherein the second circuit board is connected with the generally annular third circuit board to power the second plurality of LEDs independently from the plurality of LEDs.

20. A lighting apparatus comprising:
    a one-piece lens array including a plurality of lenses;
    a generally circular circuit board including at least one radial slot and a plurality of LEDs equally spaced arcuately in a ring on a first surface, each LED of the plurality of LEDs being aligned with a lens of the plurality of lenses;

a generally circular thermal pad configured on a second surface of the generally circular circuit board;

a control circuit board connected with the generally circular circuit board to control illumination of the plurality of LEDs, the control circuit board including a generally rectangular body portion and at least one projection extending from an edge of the generally rectangular body portion, the generally rectangular body portion being substantially perpendicular to the generally circular circuit board when the at least one projection is engaged in the at least one radial slot;

at least one generally rectangular thermal pad configured on at least one side of the generally rectangular body portion; and a heat exchanger in thermal communication with at least one of the generally circular thermal pad and the at least one generally rectangular thermal pad, the heat exchanger including an interior cavity configured to substantially encompass the generally rectangular body portion.

21. A lighting apparatus comprising:

a first circuit board including at least one LED;

a second circuit board electrically connected with the first circuit board to control illumination of the at least one LED, the second circuit board configured substantially perpendicular to the first circuit board; and a heat dissipation assembly operable to dissipate heat from the first and second circuit boards, the assembly including a heat exchanger having an interior cavity configured to substantially enclose the second circuit board.

22. The lighting apparatus of claim 21 wherein the heat dissipation assembly further comprises:

a first thermal pad configured on a side of the first circuit board opposite the plurality of LEDs; and at least one second thermal pad configured on at least one side of the body portion.

23. The lighting apparatus of claim 21 wherein the first and second circuit boards are configured to mechanically engage each other.

24. The lighting apparatus of claim 21 wherein the first circuit board is generally circular and includes at least one slot.

25. The lighting apparatus of claim 24 wherein the second circuit board includes a body portion and at least one projection extending from an edge of the body portion and substantially parallel to the body portion.

26. The lighting apparatus of claim 25 wherein the at least one slot comprises two diametrically opposed, radial slots.

27. The lighting apparatus of claim 26 wherein the at least one projection comprises two projections spaced apart along the edge, the two projections configured to engage with the two diametrically opposed radial slots.

28. The lighting apparatus of claim 21 wherein the second circuit board is configured to receive a control signal from a user interface and control a light intensity of the at least one LED according to the control signal.

29. The lighting apparatus of claim 21 further comprising a lens array including a plurality of lenses; and wherein the at least one LED comprises a plurality of LEDs, each LED of the plurality of LEDs being aligned with a lens of the plurality of lenses.

30. The lighting apparatus of claim 21 further comprising:

a third circuit board including a plurality of LEDs; and a light pipe configured to receive light from the plurality of LEDs, wherein the second circuit board is connected with the third circuit board to power the plurality of LEDs independently from the at least one LED.

31. The lighting apparatus of claim 21 wherein the heat exchanger further comprises a plurality of exterior fins.

32. A heat dissipation assembly for a lighting apparatus including a first circuit board having at least one LED, and a second circuit board configured substantially perpendicular to the first circuit board and being operable to control illumination of the at least one LED, the heat dissipation assembly comprising:

a first thermal pad configured on a side of the first circuit board opposite the plurality of LEDs;

at least one second thermal pad configured on at least one side of the body portion; and a heat exchanger in communication with the first thermal pad and the at least one second thermal pad, the heat exchanger including an interior cavity configured to substantially enclose the second circuit board.

33. The assembly of claim 32 wherein the first thermal pad is generally circular in shape.

34. The assembly of claim 32 wherein the at least one second thermal pad is generally rectangular in shape.

35. The assembly of claim 32 wherein the heat exchanger comprises at least two parts that matingly engage each other.

36. The assembly of claim 32 wherein the heat exchanger comprises aluminum.

37. The assembly of claim 32 wherein the heat exchanger further comprises a plurality of exterior fins.

38. The assembly of claim 32 wherein the heat exchanger comprises an extruded metal.

* * * * *

UNITED STATES PATENT AND TRADEMARK OFFICE
CERTIFICATE OF CORRECTION

| | | |
|---|---|---|
| PATENT NO. | : 7,738,235 B2 | Page 1 of 1 |
| APPLICATION NO. | : 11/496178 | |
| DATED | : June 15, 2010 | |
| INVENTOR(S) | : Jennifer L. Gloisten et al. | |

It is certified that error appears in the above-identified patent and that said Letters Patent is hereby corrected as shown below:

ON THE TITLE PAGE:

Item (54) and col. 1, replace the title with

LED LIGHTING APPARATUS

Signed and Sealed this

Seventeenth Day of August, 2010

David J. Kappos
*Director of the United States Patent and Trademark Office*